US006236223B1

(12) United States Patent
Brady et al.

(10) Patent No.: US 6,236,223 B1
(45) Date of Patent: May 22, 2001

(54) METHOD AND APPARATUS FOR WIRELESS RADIO FREQUENCY TESTING OF RFID INTEGRATED CIRCUITS

(75) Inventors: Michael John Brady, Brewster; Dah-Weih Duan, Yorktown, both of NY (US)

(73) Assignee: Intermec IP Corp., Woodland Hills, CA (US)

( * ) Notice: Subject to any disclaimer, the term of this patent is extended or adjusted under 35 U.S.C. 154(b) by 0 days.

(21) Appl. No.: 09/247,900

(22) Filed: Feb. 10, 1999

Related U.S. Application Data

(60) Provisional application No. 60/107,593, filed on Nov. 9, 1998.

(51) Int. Cl.$^7$ ................................................. G01R 31/26
(52) U.S. Cl. .......................................................... 324/765
(58) Field of Search ........................... 324/754, 72.5, 324/764, 601, 605, 763, 765, 158 P, 752; 713/189, 168; 714/733, 30; 370/225, 390, 400; 361/777, 774, 780; 174/260, 261; 340/870.01–870.44

(56) References Cited

U.S. PATENT DOCUMENTS 4,075,632   2/1978   Baldwin et al. .
4,360,810   11/1982  Landt .

(List continued on next page.)

FOREIGN PATENT DOCUMENTS 0 294 963   12/1988   (EP) .
0 527 321   2/1993    (EP) .
0 646 983   4/1995    (EP) .
WO 98/16070 4/1998    (WO) .

OTHER PUBLICATIONS

"RF Measurements On SIEGET Bipolar Transistors: Predicting Performance Straight From The Wafer", By: Jakob Huber and Gerhard Lohninger: XP000598992 Applications Discrete Semiconductors Mar. 1, 1996, pp. 34–36.

"Multifunction Credit Card Package", IBM Technical Disclosure Bulletin, vol. 38, No. 08, Aug. 1995, p. 17.

"A Low–Power CMOS Integrated Circuit for Field–Powered Radio Frequency Identification Tag", By Friedman et al., 1997 IEEE International Solid State Circuits Conference, Paper SA 17.5, pp. 294, 295, 474.

* cited by examiner

Primary Examiner—Safet Metjahic
Assistant Examiner—E P LeRoux
(74) Attorney, Agent, or Firm—O'Melveny & Myers

(57) ABSTRACT

A method and apparatus for wireless radio frequency (RF) testing of radio frequency identification integrated circuits (RFID IC) is disclosed. A fixture is provided for physically and electrically contacting the RFID IC to feed an RF interrogating signal into the RFID IC and receive an RF return signal generated in response thereto. The fixture is coupled to a tester via first and second couplers (interconnected to the fixture and tester, respectively) which establish a wireless link for transmitting and receiving the RF interrogation signal and the RF return signal thereby allowing full and accurate RF characterization of the RFID IC.

56 Claims, 8 Drawing Sheets

U.S. PATENT DOCUMENTS

| | | |
|---|---|---|
| 4,782,345 | 11/1988 | Landt . |
| 4,786,907 | 11/1988 | Koelle . |
| 4,816,389 | 3/1989 | Sansonetti et al. . |
| 4,835,377 | 5/1989 | Brown . |
| 4,853,705 | 8/1989 | Landt . |
| 4,864,158 | 9/1989 | Koelle et al. . |
| 4,888,591 | 12/1989 | Landt et al. . |
| 4,999,636 | 3/1991 | Landt et al. . |
| 5,028,866 | 7/1991 | Wiese . |
| 5,030,807 | 7/1991 | Landt et al. . |
| 5,055,659 | 10/1991 | Hendrick et al. . |
| 5,336,988 | 8/1994 | Chmielewski et al. . |
| 5,479,160 | 12/1995 | Koelle . |
| 5,485,520 | 1/1996 | Chaum et al. . |
| 5,504,485 | 4/1996 | Landt et al. . |
| 5,510,795 | 4/1996 | Koelle . |
| 5,521,601 | 5/1996 | Kandlur et al. . |
| 5,528,222 | 6/1996 | Moskowitz et al. . |
| 5,538,803 | 7/1996 | Gambino et al. . |
| 5,550,547 | 8/1996 | Chan et al. . |
| 5,552,778 | 9/1996 | Schrott et al. . |
| 5,554,974 | 9/1996 | Brady et al. . |
| 5,563,583 | 10/1996 | Brady et al. . |
| 5,565,847 | 10/1996 | Gambino et al. . |
| 5,606,323 | 2/1997 | Heinrich et al. . |
| 5,635,693 | 6/1997 | Benson et al. . |
| 5,673,037 | 9/1997 | Cesar et al. . |
| 5,680,106 | 10/1997 | Schrott et al. . |
| 5,682,143 | 10/1997 | Brady et al. . |
| 5,729,201 | 3/1998 | Jahnes et al. . |
| 5,729,697 | 3/1998 | Schkolnick et al. . |
| 5,736,929 | 4/1998 | Schrott et al. . |
| 5,737,710 | 4/1998 | Anthonyson . |
| 5,739,754 | 4/1998 | Schrott et al. . |
| 5,767,789 | 6/1998 | Afzali-Ardakani et al. . |
| 5,771,021 | 6/1998 | Veghte et al. . |
| 5,777,561 | 7/1998 | Chieu et al. . |
| 5,786,626 | 7/1998 | Brady et al. . |
| 5,812,065 | 9/1998 | Schrott et al. . |
| 5,821,859 | 10/1998 | Schrott et al. . |
| 5,825,329 | 10/1998 | Veghte et al. . |
| 5,826,328 | 10/1998 | Brady et al. . |
| 5,828,318 | 10/1998 | Cesar et al. . |
| 5,828,693 | 10/1998 | Mays et al. . |
| 5,831,532 | 11/1998 | Gambino et al. . |
| 5,850,181 | 12/1998 | Heinrich et al. . |
| 5,850,187 * | 12/1998 | Carrender et al. .............. 340/825.54 |
| 5,874,902 | 2/1999 | Heinrich et al. . |
| 6,049,308 * | 4/2000 | Hietala et al. ........................ 343/700 |

METHOD AND APPARATUS FOR WIRELESS RADIO FREQUENCY TESTING OF RFID INTEGRATED CIRCUITS

This application claims benefit of Provisional No. 60/107,593, filed Nov. 9, 1998.

FIELD OF THE INVENTION

The present invention relates generally to radio frequency (RF) transponders such as radio frequency identification (RFID) transponders, and more specifically to a method and apparatus for testing radio frequency circuits, particularly radio frequency integrated circuits such as radio frequency identification integrated circuits (RFID IC).

BACKGROUND OF THE INVENTION

Conventional methods and apparatus for testing radio frequency integrated circuits (RFIC) require the use of radio frequency (RF) contacts. For example, a wafer containing unsingulated RFIC chips (dies) may be placed on a probe station whereupon a probe is used to make contact with each RFIC. Once this connection is established, interrogating signals modulated on an RF signal are fed into the RFIC, and the responses (the returned signal) are analyzed in order to determine whether the RFID functions properly. Alternatively, the RFIC's may first be singulated from the wafer and packaged in plastic packages. The RF test can then be performed by placing the packaged chip on a "load board." Such load boards comprise circuit boards containing fixtures for mounting the packaged RFIC in a temporary manner and a circuit for feeding an RF interrogation signal into the packaged RFIC to facilitate testing.

In either testing method, the RF interrogation signals are sent from a tester to the RFIC through a cable (e.g., a coaxial cable). Thus, the entire testing circuit consists of wired connections, and the testing signals (i.e., the interrogating signal and the responded signal) are well contained in a guide wave structure. While use of such "wired" test apparatus and methods provides satisfactory testing of most RFIC's, some functionalities of radio frequency identification integrated circuits (RFID IC) require a "wireless" RF test (i.e., a "field" test). For example, some circuits of the RFID IC, which are supposed to operate in the RF field, may appear to be functioning properly with the conventional wired test methods, but may later be found to be functioning improperly when packaged into RFID transponders and placed in an RF field where the RF signal is contaminated with noises and suffers from distortions caused by the time-varying characteristics of the wireless link and interference from surrounding objects. Similarly, it is difficult to determine whether the memory of the RFID IC's will be properly written in the field even though they can be properly written using the wired testing methods. Further, the read distance of an RFID IC (or an RFID transponder) can only be truly determined through a wireless RF test with appropriate calibration. It is therefore desirable to provide a method and apparatus for performing wireless radio frequency testing of RFID IC's so that they may be more fully characterized and tested.

SUMMARY OF THE INVENTION

Accordingly, the present invention is directed to novel method and apparatus for performing wireless radio frequency (RF) testing of radio frequency circuits and particularly radio frequency integrated circuits such as radio frequency identification integrated circuits (RFID IC's). A fixture is provided for physically and electrically contacting the circuit to feed an RF interrogating signal into the circuit and receive an RF return signal generated in response thereto. The fixture is coupled to a tester via first and second couplers (interconnected to the fixture and tester, respectively) which establish a wireless radio frequency link for transmitting and receiving the RF interrogation and return signals.

Advantages provided by the present invention include: (1) the ability to perform wireless RF testing on RFID IC's without packaging the chips into RFID transponders; (2) the provision of full and accurate RF characterization of RFID IC's; (3) the capacity to perform wireless RF testing of RFID IC's in high volume and at low cost.

It is to be understood that both the foregoing general description and the following detailed description are exemplary and explanatory only and are not restrictive of the invention claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous objects and advantages of the present invention may be better understood by those skilled in the art by reference to the accompanying figures in which.

DETAILED DESCRIPTION OF THE INVENTION

Disclosed are methods and apparatus for performing wireless radio frequency (RF) testing of radio frequency circuits and particularly radio frequency integrated circuits such as radio frequency identification integrated circuits (RFID IC). Wireless RF testing is herein defined as a test of the functionality of the circuit (e.g., RFID IC) where at least a portion of the information path is through a wireless link using a radiation wave at a radio frequency. The present invention allows testing of radio frequency integrated circuits (e.g.,RFID IC's) before their singulation from a wafer, after their singulation from the wafer, or after they have been packaged in an injection-molded plastic package such as a Small Outline Package (SOP), Miniature Small Outline Package (MSOP), Small Outline Integrated Circuit (SOIC), Plastic Ball Grid Array (PBGA), Thin Quad Flat Pack (TQFP), Low Profile Quad Flat Pack (LQFP), Metric Quad Flat Pack (MQFP), Plastic Quad Flat Pack (PQFP), Plastic Leaded Chip Carrier (PLCC), Thin Shrinkable Small Outline Package (TSSOP), Shrinkable Small Outline Package (SSOP), Quad Small Outline Package (QSOP), Plastic Dual Inline Package (PDIP), SC 70, SC-79, Small Outline Transistor (SOT-23, SOT-143), Small Outline Diode (SOD-323) package, or the like. Reference will now be made in detail to the presently preferred embodiments of the invention, examples of which are illustrated in the accompanying drawings.

Figure 1:
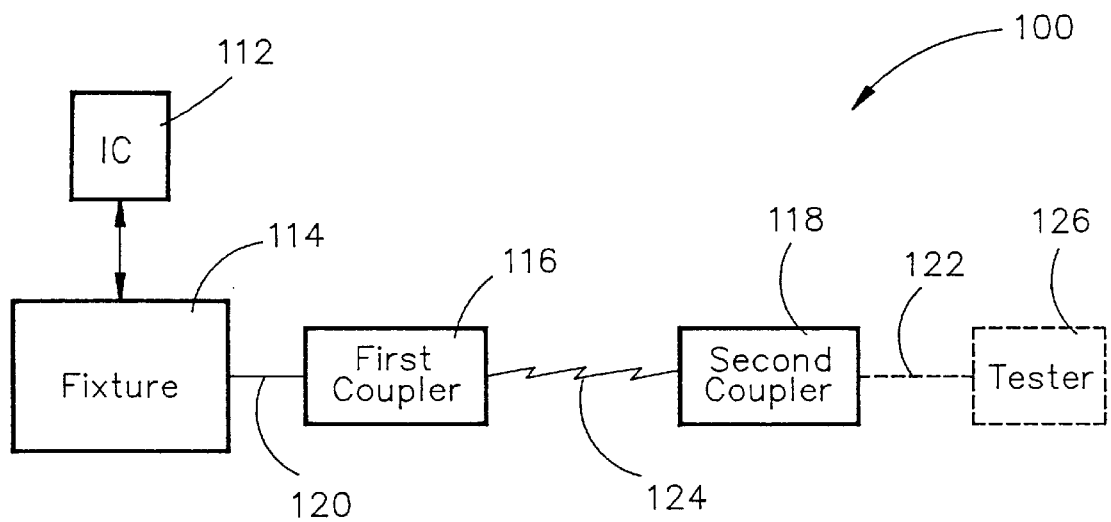
FIG. 1 is a block diagram depicting a system providing a method and apparatus for performing wireless RF testing of RFID IC's in accordance with the present invention.

Referring now to FIG. 1, a block diagram generally depicting a system 100 providing a method and apparatus for performing wireless RF testing of RFID IC's 112 in accordance with the present invention is shown. The system 100 includes a fixture 114 for physically and electrically contacting an RFID IC 112 under test. The fixture 114 feeds an RF interrogating signal generated by a tester 126 into the RFID IC 112. Additionally, the fixture 114 may receive an RF return signal generated by the RFID IC 112 in response to the RF interrogation signal (wherein the RFID IC is functioning to the extent it is capable of generating and RF return signal). Testers 126 which may be utilized with the present invention preferably comprise an RF interrogation signal transmitter for generating or back-scattering an RF interrogating signal to interrogate the RFID IC 112. Such testers 126 may also include a decoder for decoding RF return signals generated by the RFID IC 112 in response to the RF interrogation signal.

First and second couplers 116 & 118 couple the fixture 114 and the tester 126 via a wireless radio frequency link 124. The first coupler 116 is interconnected to the fixture 114 via connector 120, and the second coupler 118 is interconnected with the tester 126 via connector 122. The first coupler 116 receives the RF interrogating signal (transmitted from the second coupler 118) and propagates the signal to the fixture 114 where it is fed into the RFID IC 112. The first coupler 116 may also transmit the RF return signal to the second coupler 118 (or, alternatively, a third coupler (not shown)). Similarly, the second coupler 118 receives the propagated RF interrogation signal from the tester 126 and transmits the RF interrogating signal to the first coupler 116. The second coupler 118 may also receive the RF return signal transmitted by the first coupler 116 wherein it may be propagated to the tester 126. In this manner, the wireless link is established and supported by the first and second couplers 116 & 118. This allows more comprehensive testing and characterization of the RFID IC 112.

In an exemplary embodiment of the present invention (see FIGS. 2A, 2B, 2C, 3A, and 3B), the first and second couplers 116 & 118 may comprise antennas. The antennas may be placed far apart (e.g., at least several wave lengths, or at the far-field of each other), or proximity coupled. Such antennas may have a variety of configurations and geometries (e.g., dipole antennas, loop antennas, patch antennas, slot antennas, horn antennas, reflector antennas, etc.) depending on such factors as which characteristics of the RFID IC 112 are to be tested, the convenience or the space allowed for testing the RFID IC 112, and the requirements of the specific RFID system with which the RFID IC 112 is to be used. Thus, it should be appreciated that substitution of one type of antenna for another by one of ordinary skill in the art would not depart from the scope and spirit of the invention.

In place of an antenna, the first and second couplers 116 & 118 may alternatively comprise other types of electromagnetic coupling devices such as open-ended waveguide couplers, tunnel-like wave launchers, etc. Such devices should, however, furnish a wireless means by which the RF interrogation and return signals are transmitted between the tester 126 and the RFID IC 112 via radiation (as opposed to guided waves).

Turning now to FIGS. 2A, 2B, 2C, and 2D exemplary systems 200 for providing wireless RF testing of RFID IC's 212 prior to their singulation from a wafer 214 are shown. The fixture 216 of such a system 200 preferably includes a probe 218 for physically and electrically contacting unsingulated RFID IC's or dies 212 of the wafer 214. The fixture 218 feeds the RF interrogating signal generated by the tester 228 into the RFID IC 212. The fixture 216 may also receive (via the probe/RFID IC contact) the RF return signal generated or back-scattered by the RFID IC 212 in response to the RF interrogation signal (provided the RFID IC 212 is functioning to the extent that an RF return signal is generated). The fixture 216 may further include an impedance matching circuit, if necessary, to match the impedance of the testing system (usually about 50 ohms ($\Omega$)) to that of the RFID IC 212 under test so that power loss due to impedance mismatch is minimized. Optionally, the fixture 216 may include a second probe (not shown) that may be used to supply direct current (DC) power to the RFID IC 212 wherein the RFID IC 212 is powered by an external power supply (e.g., a battery) and has a separate pad or pads for connection of the power supply.

Figure 2A:
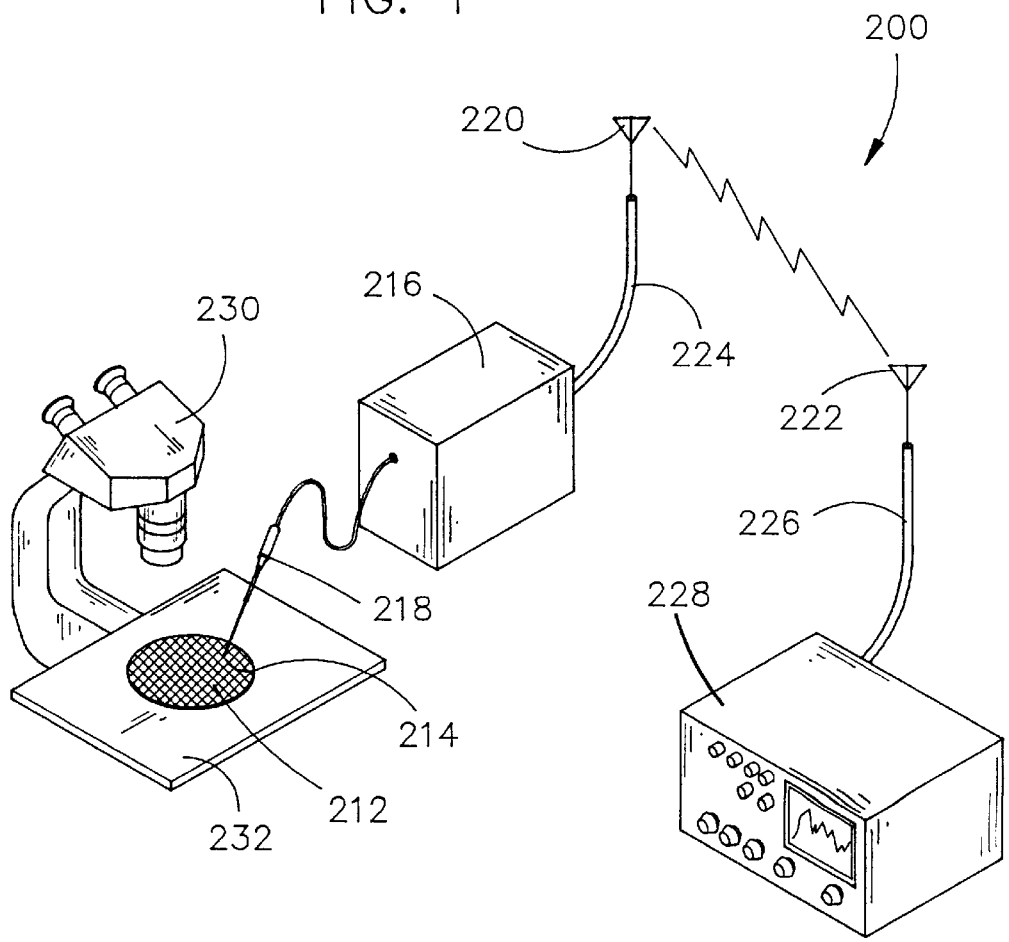
FIG. 2A is an isometric view illustrating an exemplary embodiment of the system shown in FIG. 1 utilized for testing unsingulated RFID IC's in a wafer.
Figure 2B:
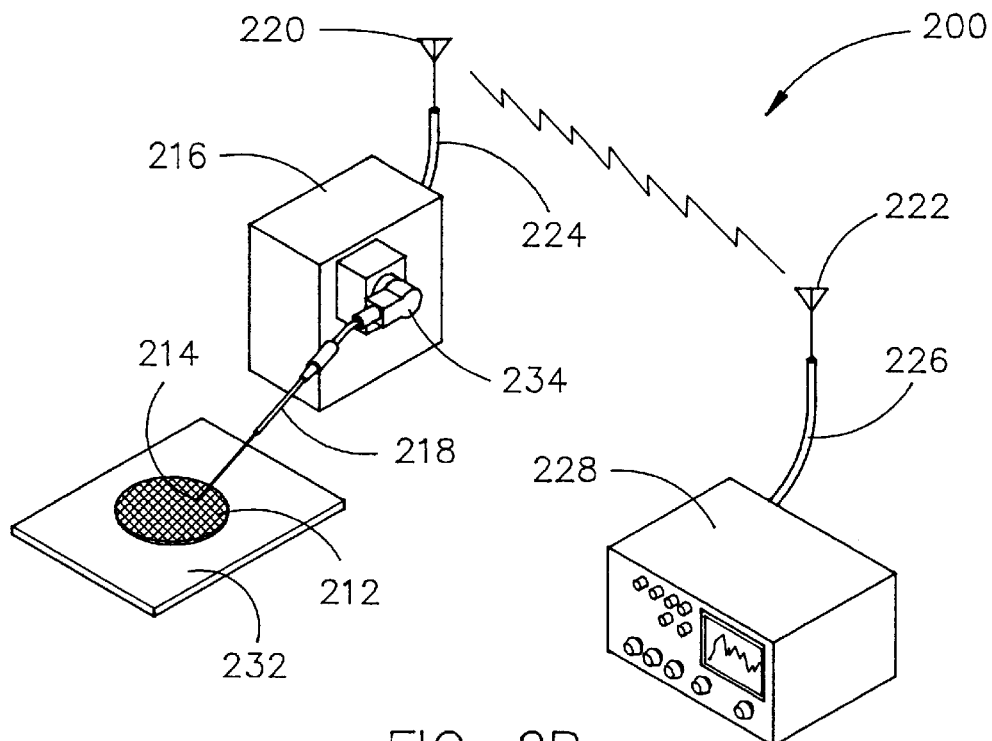
FIG. 2B is an isometric view illustrating an alternative embodiment of the system shown in FIG. 2A wherein the apparatus is automated.
Figure 2C:
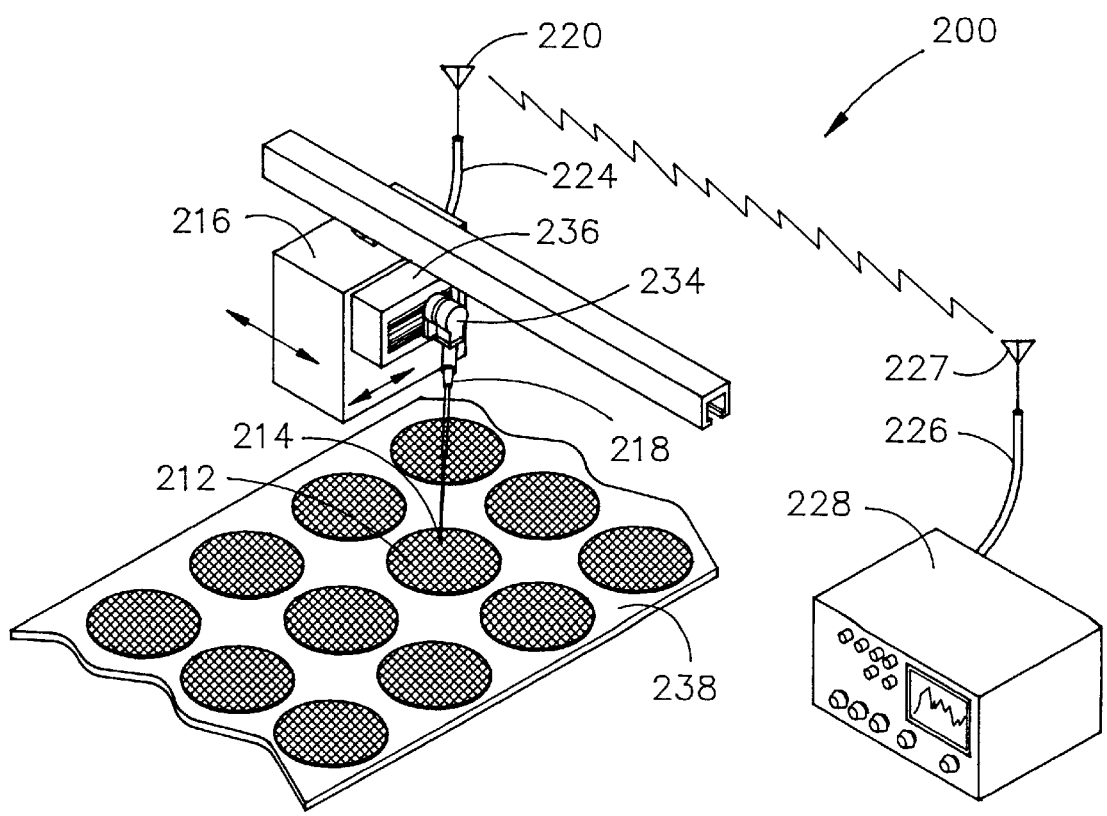
FIG. 2C is an isometric view illustrating an alternative embodiment of the system shown in FIG. 2B adapted for use with multiple wafers of RFID IC's.
Figure 2D:
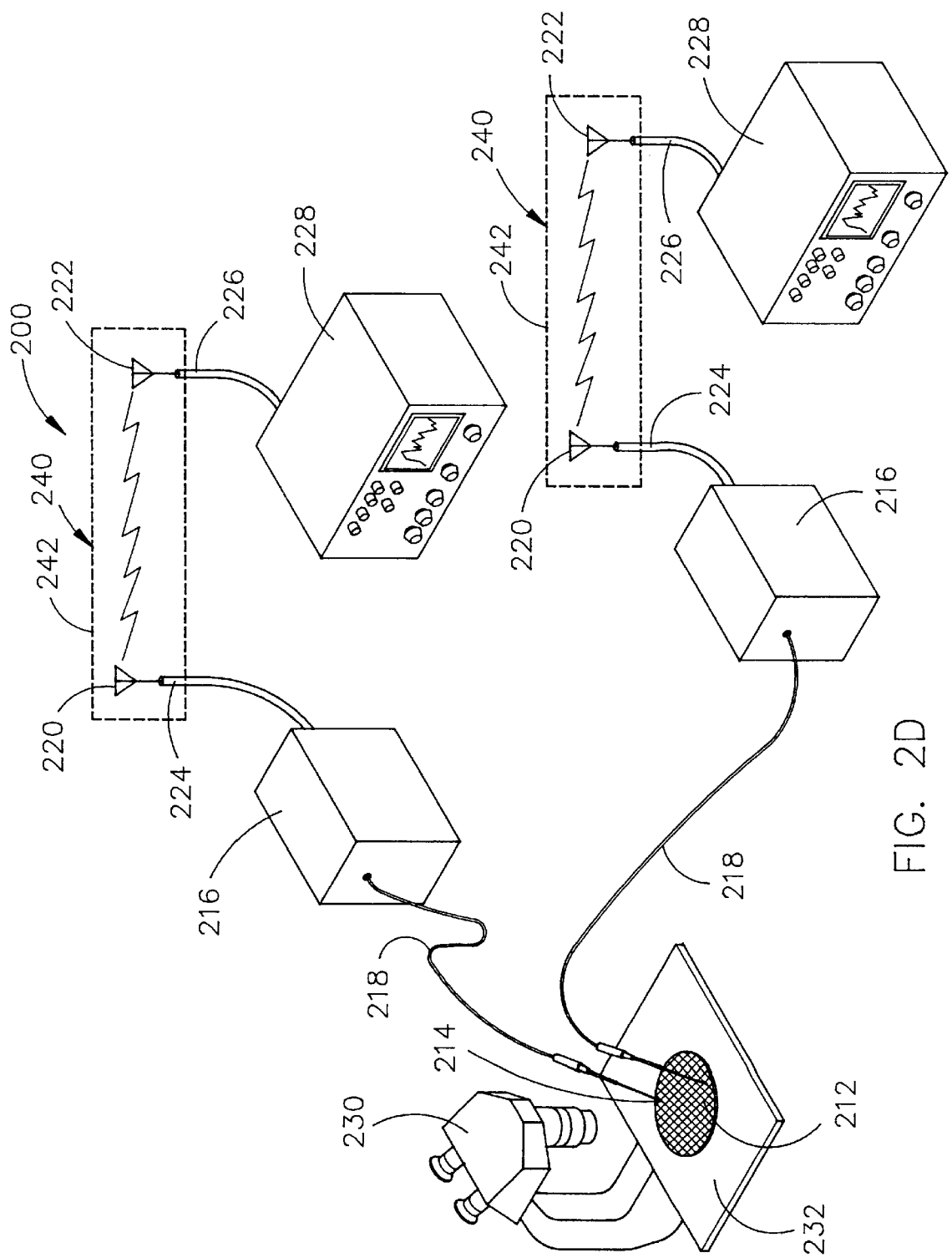
FIG. 2D is an isometric view illustrating an alternative embodiment of the system shown in FIG. 2B having multiple testing assemblies.

As shown in FIG. 2A, the probe 218 may be hand-held. A magnification device 230 such as a microscope, stereo microscope, etc. may be used by an operator to view the RFID IC 212 to properly locate the antenna pads of the RFID IC for contact by the probe 218. Alternately, as shown in FIGS. 2B, 2C, and 2D, the probe 218 may be mounted to a computer controlled robotic arm 234 (FIG. 2B) and/or translation stage 236 (FIG. 2C) which is capable of moving the probe 218 to any desired location precisely and swiftly.

The tester 228 preferably comprises an RF interrogation signal transmitter for generating the RF interrogating signal to interrogate the RFID IC 212 and a decoder for decoding RF return signals generated by the RFID IC 112 in response to the RF interrogation signal. The tester 228 may be a commercially available RF interrogator (e.g., a network analyzer, RF signal analyzer, etc.), a computer-controlled RFID base station, or a custom-designed testing apparatus.

First and second antennas 220 & 222 couple the fixture 216 and the tester 228 via a wireless radio frequency link.

Thus, the antennas 220 & 222 function as the first and second couplers 116 & 118 (as shown in FIG. 1) for the system 200. Preferably, the first and second antennas 220 & 222 are interconnected with the fixture 216 and the tester 228, respectively, via connectors such as coaxial cables 224 & 226, or the like.

A wafer 214 containing multiple unsingulated RFID IC's or dies 212 is loaded onto a probe station 232 (FIGS. 2A and 2B) & 238 (FIG. 2C). As shown in FIGS. 2A and 2B, the probe station 232 may hold a single wafer 214, or, alternatively, as shown in FIG. 2C, may comprise a conveyor system or the like capable of holding multiple wafers 214. Further, as shown in FIG. 2D, multiple probe/tester assemblies 240 may be used to simultaneously test two or more IC's or dyes 214 of a single wafer 212 provided the wireless link of each assembly 240 does not interfere with the wireless links of any other assembly 240. For example, in the embodiment shown, RF shields (e.g., an antenna chamber or the like) 242 may prevent the RF field generated by each assembly 240 from interfering with the RF field generated by each of the other assemblies 240.

Each RFID IC 212 is physically and electrically contacted by landing the probe 218 on RFID IC's antenna contacts or pads (not shown). During testing of the RFID IC's 212, the tester 228 generates RF interrogating signals which are propagated through the coaxial cable 226 to the second antenna 222. The RF interrogating signal is radiated by the second antenna 222 into space to form an electromagnetic wave also commonly referred to as an "electromagnetic field" or simply a "field." The first antenna 220 receives the electromagnetic wave, which propagates through the coaxial cable 224 to the fixture and then to the RFID IC 222 via the probe 218. Preferably, the RFID IC 212 processes the RF interrogation signal, and modulates back-scattered wave (when functioning properly) thereby generating the RF return signal. The RF return signal is propagated through the coaxial cable 224 to the first antenna 220 where it may also be radiated into space as an electromagnetic wave. The second antenna 222 receives the electromagnetic wave, which propagates through the coaxial cable 226 to the tester 228 where it is decoded in order to characterize the RFID IC 212.

It should be noted that it would also be possible to test each RFID IC 212 after singulation from the wafer 214. However, RFID IC chips are extremely small in size (typically about 2 mm by 2 mm or less) making their testing after singulation more difficult to perform, more expensive, and more time consuming. Further, it would be possible to transmit the RF return signal to a device other than the tester 228. This may be accomplished via a second wireless RF link, or via a connector such as a coaxial cable or the like.

Figure 3A:
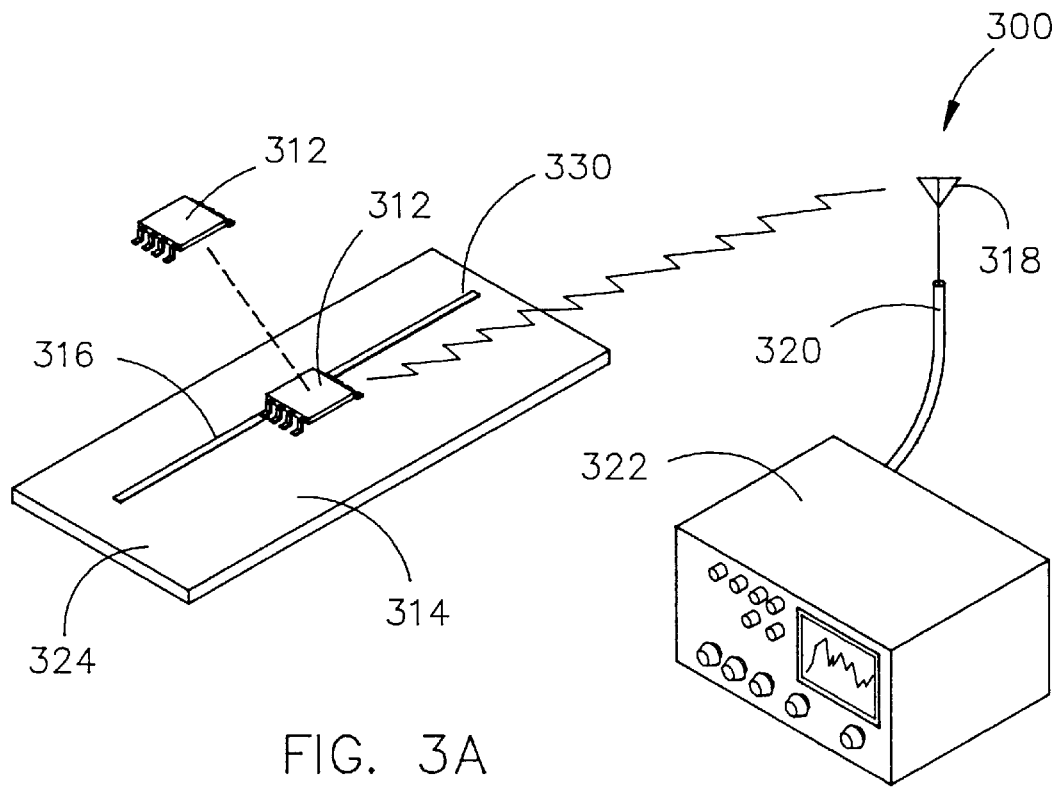
FIG. 3A is an isometric view illustrating an exemplary embodiment of the system shown in FIG. 1 utilized for testing packaged RFID IC's.
Figure 3B:
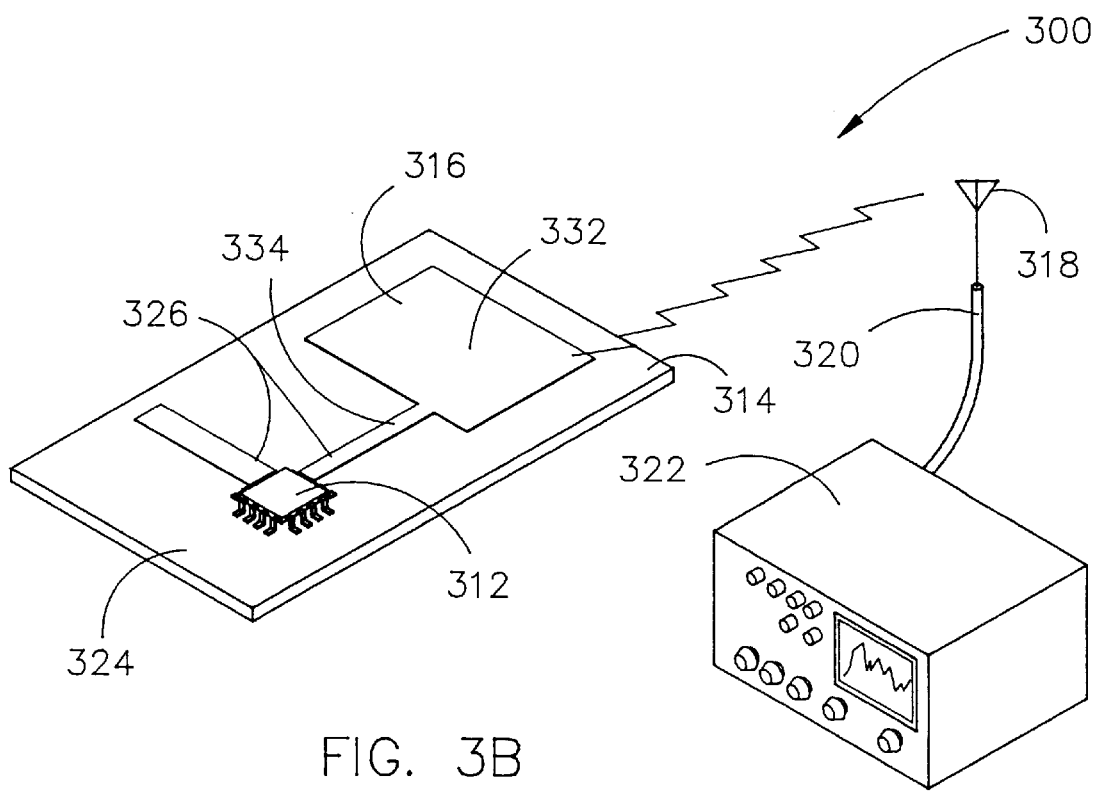
FIG. 3B is an isometric view illustrating an alternative embodiment of the system shown in FIG. 3A having a patch antenna.

Referring now to FIGS. 3A and 3B, an exemplary system 300 for performing wireless RF testing of packaged RFID IC's 312 is shown. The fixture 314 of this system 300 includes a support 324 onto which packaged RFID IC's 324 may be temporarily mounted. An antenna 316 is coupled to the packaged RFID IC 312 while it is mounted to the support 324. Preferably, one or more holders (i.e., spring-loaded clamps) hold the leads of the RFID IC 312 against the terminals of the antenna 316 during testing in order to ensure good electrical contact.

As shown in FIGS. 3A and 3B, the antenna 316 may be integrally formed on the support 324. The antenna 316 may be directly connected to the RFID IC 312, or may be interconnected to the RFID IC 312 through a transmission line system 326 formed on or attached to the support 324. For example, as shown in FIG. 3A, the antenna 316 may be a dipole antenna 330 directly connected to the RFID IC 312 while it is temporarily mounted to the support 324. Alternately, as shown in FIG. 3B, the antenna 316 may be a patch antenna 332 coupled with the RFID IC 312 via micro strip lines 334. It should be appreciated that many antenna configurations and transmission line systems are possible, and substitution of alternate antenna configurations and transmission line systems for those shown in FIGS. 3A and 3B by one of ordinary skill in the art would not depart from the scope and spirit of the invention. Further, the antenna 316 may be separate from the support 324 and may be interconnected to the support 324 via an external transmission line system such as a coaxial cable or the like to be coupled to the packaged RFID IC 312.

As shown in FIGS. 3A and 3B, the fixture 314 may be comprised of a single support 324 for testing one packaged RFID IC 312 at a time. A second antenna 318 is interconnected to the tester 322 via a connector such as coaxial cable 320. The second antenna 318 may, for example, be similar to a conventional RFID base station antenna. Packaged RFID IC's 312 are temporarily mounted to the fixture 314 and interconnected to the first antenna 316. Each packaged RFID IC 312 is then tested within the RF interrogation field (i.e., an RF interrogation signal is fed into the RFID IC 312 via the first antenna 316), removed from the fixture 314 and sorted according to its functionality. In an exemplary embodiment, the RFID IC's 312 may be mounted and dismounted from the fixture 314 by conventional feeding and sorting apparatus (not shown). After testing, such feeding and sorting apparatus may automatically package the RFID IC's in a desired format (i.e., tubes, reels, tapes, etc.) for shipping, sale, or storage. Such feeding and sorting apparatus, which rapidly feed, sort, pick, and place packaged integrated circuits in desired positions and orientations are well known to the art and will not be further described herein.

Referring now to FIGS. 4A, 4B, 5A and 5B, the fixture may include multiple supports for providing rapid testing of a plurality of packaged RFID IC's.

Figure 4A:
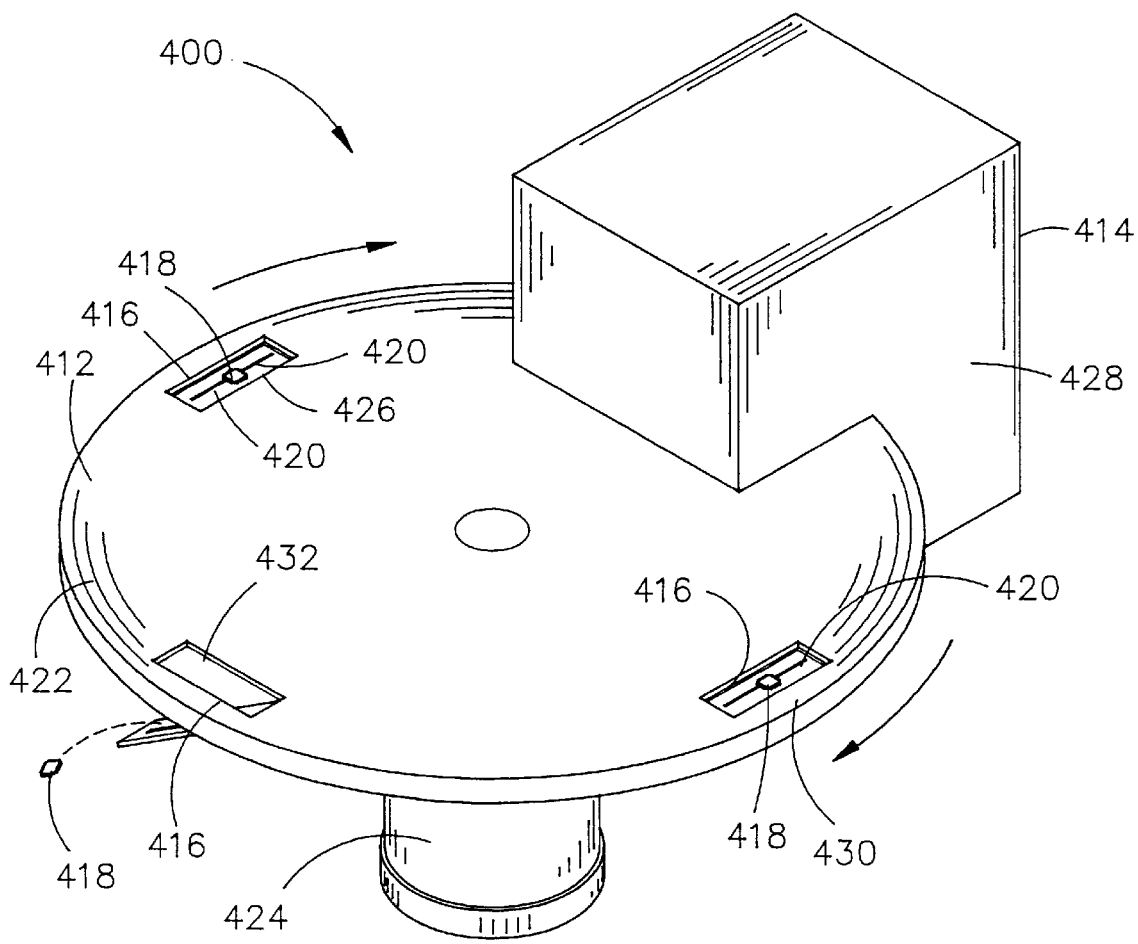
FIG. 4A is an isometric view of an apparatus for testing RFID IC's in accordance with an exemplary embodiment of the present invention wherein the testing apparatus having a rotatable stage for positioning RFID IC's within a testing chamber.
Figure 4B:
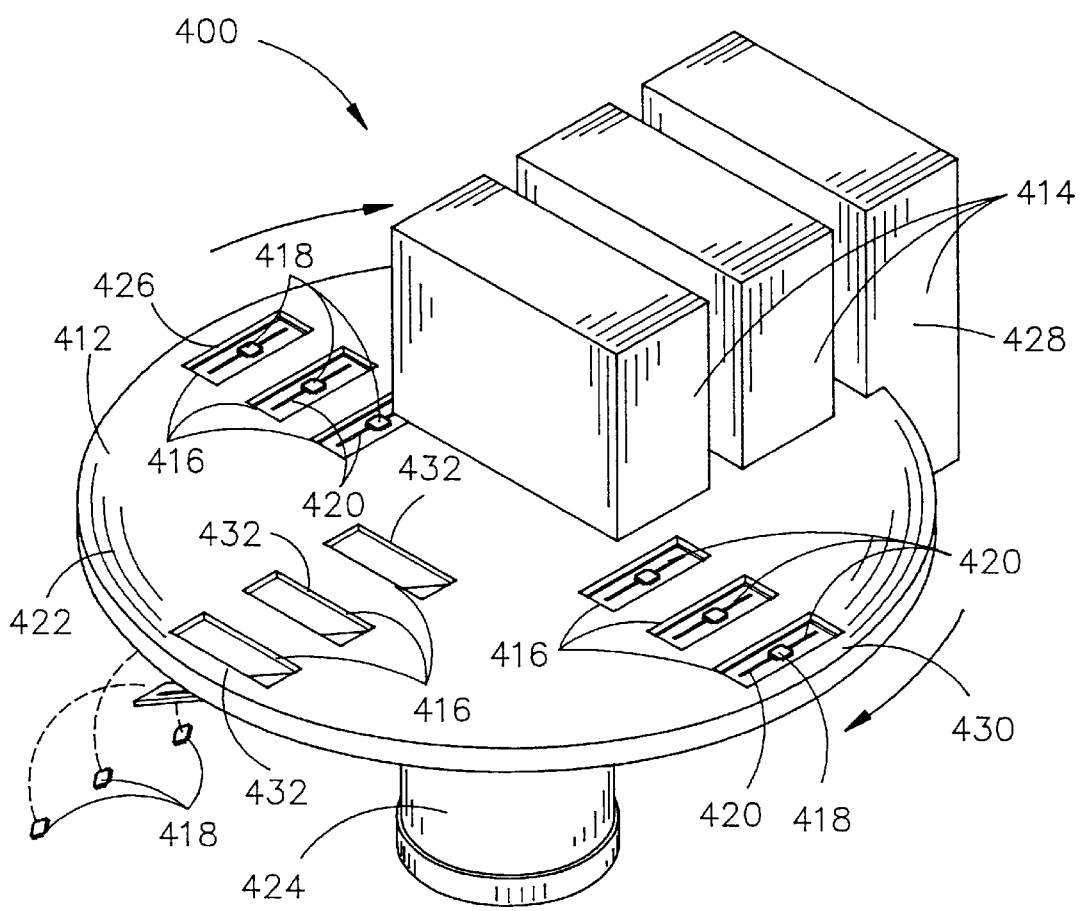
FIG. 4B is an isometric view of an apparatus for testing RFID IC's in accordance with the an exemplary embodiment of the present invention comprised of a testing apparatus having a rotatable stage for simultaneously positioning multiple RFID IC's within multiple testing chambers.

As shown in FIGS. 4A and 4B, an exemplary fixture 400 includes a carriage assembly 412 and an RF shield or test chamber 414. The carriage assembly 412 includes multiple supports 416 (e.g., supports 324 shown in FIGS. 3A and 3B) onto which a packaged RFID IC 418 is temporarily mounted for testing. Each support 416 includes an antenna 420 which is coupled to the packaged RFID IC 418 while it is mounted to the support 416. The antenna 420 may be directly connected to the RFID IC 418, or may be interconnected to the RFID IC 418 through a transmission line system formed on or attached to the support 416 (see the description of FIGS. 3A and 3B).

The carriage assembly 412 sequentially positions each support 416 having an RFID IC 418 temporarily mounted thereto and connected to the antenna 420 thereof, within the test chamber 414 where it is exposed to the RF interrogation field generated by a test assembly (e.g., the tester 322 and antenna 318 shown in FIGS. 3A and 3B). The carriage assembly 412 is comprised of a generally circular rotatable stage or turntable 422 having the supports 416 arrayed on its upper surface. The stage 422 partially extends into the test chamber 414 so that only one of the supports 416, and the RFID IC 418 mounted thereon, is enclosed within the chamber 414 for testing.

The carriage assembly 412 includes a drive system 424 for rotating the stage 422. Preferably, the drive system 424 includes a transmission which indexes the stage 424 to sequentially position each support 416, and the RFID IC 418 mounted thereon, within the test chamber 414. Indexing of the stage 424 is accomplished by causing the drive system 424 to periodically rotate the stage 424 through a predetermined arc so that each support 416 is rotated within the test chamber 414 for a period of time sufficient for testing of the RFID IC 418.

The test chamber 414 provides an RF shield for isolating RFID IC's 418 which are mounted to a support 412 and coupled to an antenna 420 from the RF interrogation field generated within the test chamber 414. Thus, only the RFID IC 418 (and support 412 and antenna 420) which is contained within the test chamber 414 is exposed to the RF interrogation field.

In an exemplary embodiment, the test chamber 414 may comprise a miniaturized anechoic chamber-formed of or lined with RF absorbing material. This RF absorbing material creates an anechoic environment which simulates a free space. The RF absorbing material may also sufficiently reduce RF emissions from the test chamber 414 so that any RF field outside of the chamber 414 has insufficient intensity to activate an RFID IC.

Alternatively, the test chamber 414 may comprise a metallic box (or cylinder, sphere, etc.) forming a resonant cavity sized to have a resonant frequency which is the same as the RFID system's carrier frequency. The resonant cavity may be excited by a probe (i.e., a hook or pin) which couples the RF power in a transmission line (i.e., a coaxial cable) from the transceiver to the field in the resonant cavity. See, R. E. Collin, *Foundations for Microwave Engineering*, 2nd Ed., McGraw Hill, 1992, which is herein incorporated by reference in its entirety.

An exemplary stage 422, as shown in FIG. 4A, may have four supports 416 arranged at ninety (90) degree intervals about its perimeter. A first of the supports 416 may be positioned at a first or "loading" position 426 by the drive system 424 so that an packaged RFID IC 418 may be temporarily mounted to the support 416 and connected to the antenna 420. The drive system 424 may then index the stage 422 so that the support 416, and RFID IC 418 mounted thereon, is rotated ninety (90) degrees and positioned within the test chamber 414 and tested. Thus, the test chamber 414 comprises a second or "testing" position 428. Preferably, the RF interrogation field activates and tests the RFID IC 418 and writes any necessary information to the IC's memory. Indexing of the stage 422 also moves a second of the supports 416 into the loading position 426 so that an RFID IC 418 may be mounted to the support 416 and coupled to the antenna 420.

After testing and/or writing of the RFID IC 418 mounted to the first support 416 and loading of an RFID IC 418 into the second holder 416 is accomplished, the drive system 424 may again index the stage 422 ninety (90) degrees. The first support 416, and the now tested RFID IC 418 mounted thereon, is moved to a third or "unloading" position 430 where the RFID IC 418 may be removed from the support 416. The second support 416, and the RFID IC 418 thereon, is moved into the test chamber 414 where the RFID IC 416 is tested. Indexing of the stage 422 also moves a third of the supports 416 into the loading position 426 so that an RFID IC 418 may be mounted to the third support 416.

The drive system 424 may again index the stage 422 ninety (90) degrees so that the first support 416 is moved to a fourth or "final" position 432. If the RFID IC 418 mounted to the first support 416 was not previously removed at the third ("unloading") position 430, it is removed from the support 416. The second support 416, and the now tested RFID IC 418 mounted thereon, is moved to the third ("unloading") position 430. Indexing of the stage 422 also moves the third support 416, and the RFID IC 418 mounted thereon, into the test chamber 414 to be tested, and moves a fourth of the supports 416 into the loading position 426 so that a RFID IC 418 may be loaded onto the support 416. The drive system 424 may index the stage 422 so that the first support 416, now empty, is again moved to the first ("loading") position 426 to receive another untested packaged RFID IC 418.

Preferably, packaged RFID ICs 418 are mounted or loaded onto the supports 416 of fixture 400 using automated loading apparatus such as a conveyer system, robotic arm, or the like (not shown). After testing, the packaged RFID IC's 418 may be removed from the supports 416 via similar apparatus. For example, as shown in FIGS. 4A and 4B, each support 416 may be pivotally mounted to the stage 422. As a support 416 is moved into either the third ("unloading") position 430 and the fourth ("final") position 432, the support 416 may pivot downward from the stage 422 allowing the RFID IC 418 to be released and dropped. Further, the third ("unloading") position 430 and the fourth ("final") position 432 may be used as a means to sort the tested RFID IC's 418 based on their functional performance. For example, a non-functioning or improperly functioning RFID IC 418 may be unloaded from the stage 422 at the third ("unloading") position 432 while the remaining properly functioning tags 432 are unloaded from the stage 422 at the fourth ("final") position 432 (or vice versa). The non-functioning or improperly functioning RFID IC's 418 may then be repaired, discarded, destroyed or subjected to further testing to discover the cause of their failure to properly function. Alternatively, the RFID IC 418 may be placed on and removed from the supports 416 manually.

As shown in FIG. 4B, the fixture 400 may be expanded to include multiple test chambers 414 (three are shown) so that multiple RFID IC's 418 may be tested simultaneously. The carriage assembly 412 may include a corresponding number of supports 416 (e.g., four rows of three supports 416 each arranged at ninety (90) degree intervals about the stage 422) so that an RFID IC 418 may be positioned within each chamber 414. In this manner, testing throughput may be increased without use of multiple test assemblies.

Preferably, the stage 422 may be continuously indexed so that each of the supports 416 is repeatedly positioned at the "loading" 426, "testing" 428, "unloading" 430, and "final" 432 positions. In this manner, fixture 400 may be used in a manufacturing or assembly environment to provide rapid testing of packaged RFID IC's 418.

Figure 5A:
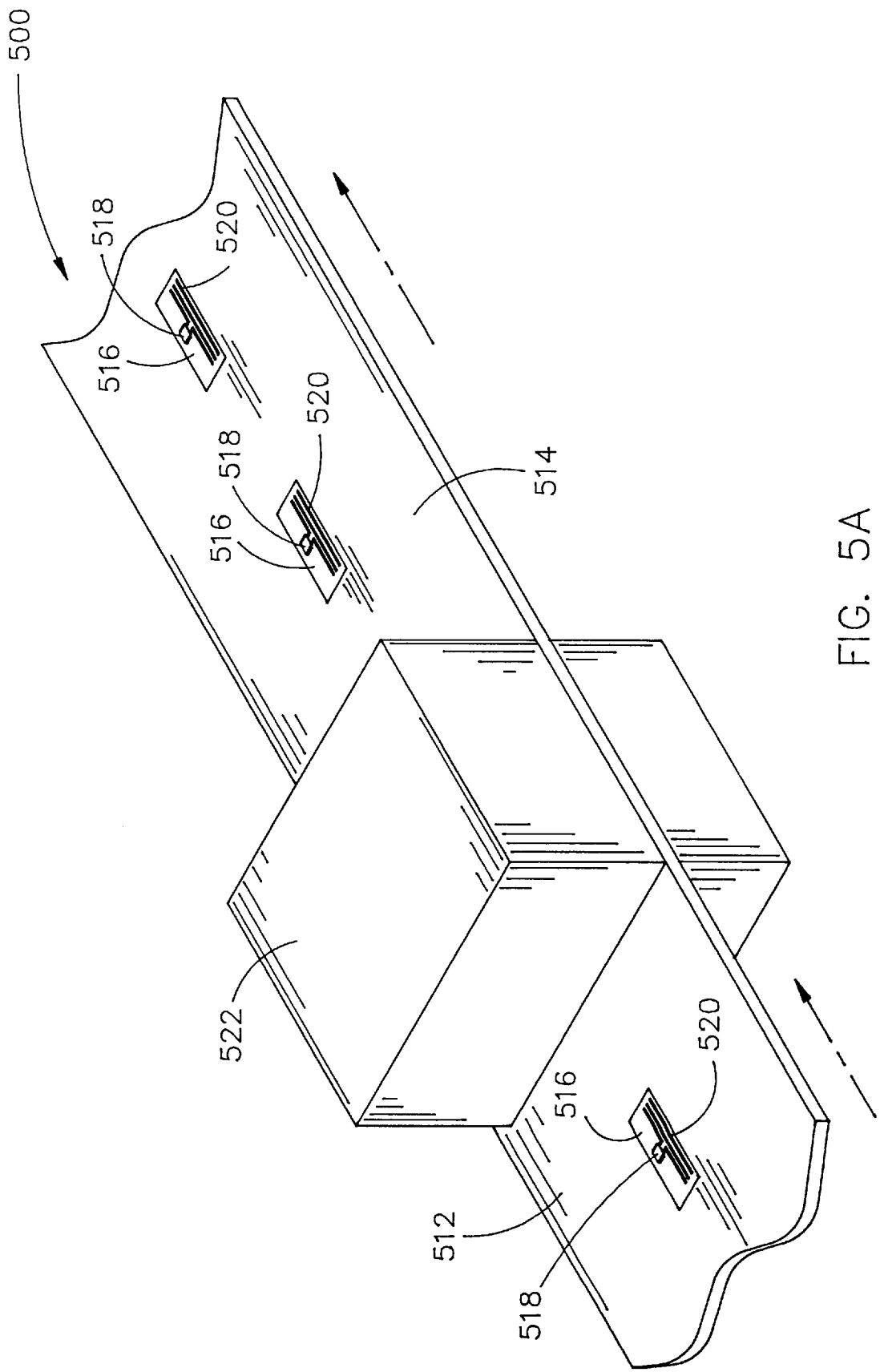
FIG. 5A is an isometric view of an apparatus for testing RFID IC's in accordance with a second exemplary embodiment of the present invention comprised of a testing apparatus having a conveyor for positioning RFID IC's within a test chamber.
Figure 5B:
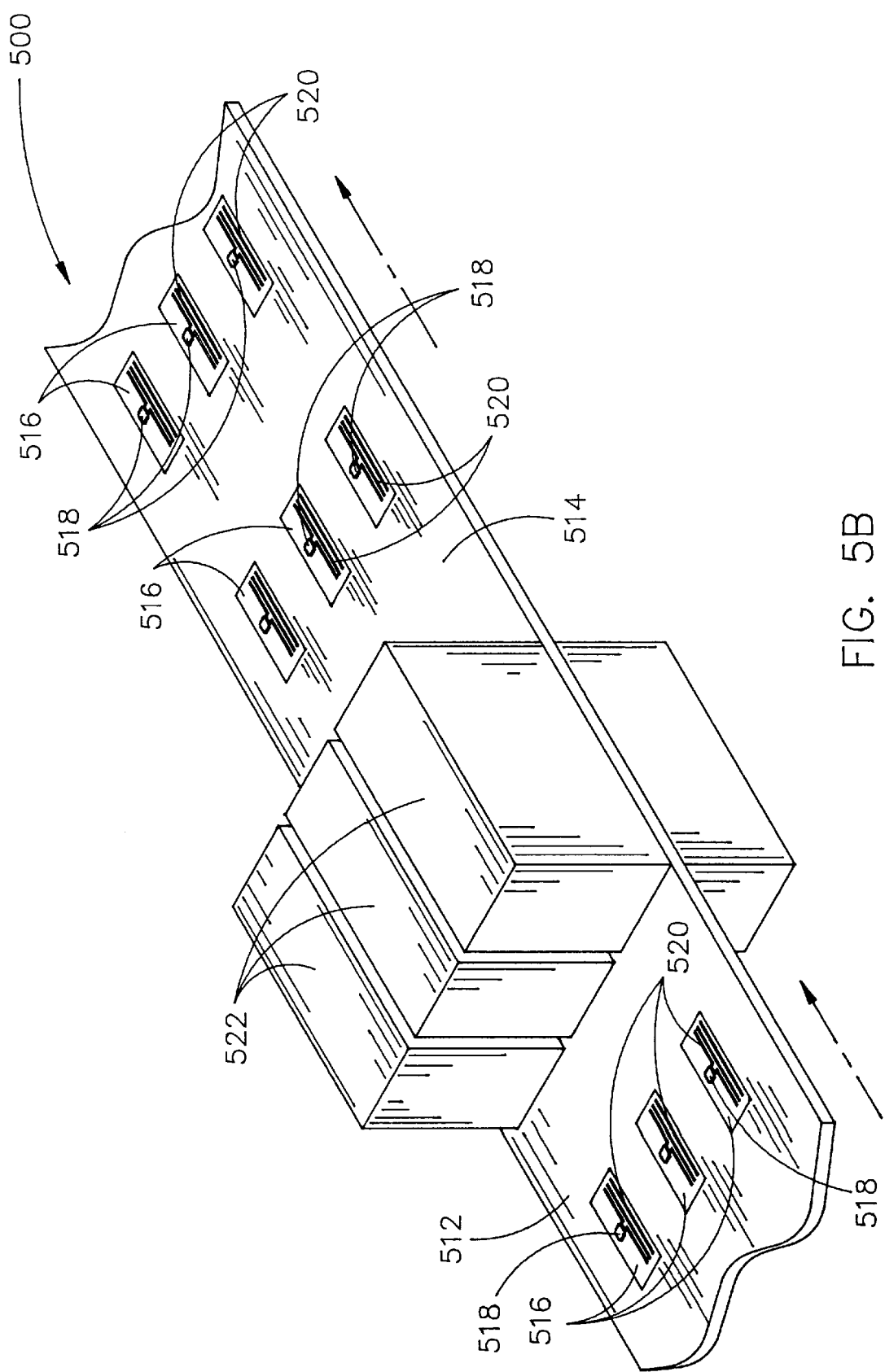
FIG. 5B is an isometric view of an apparatus for testing RFID IC's in accordance with the second exemplary embodiment of the present invention wherein the testing apparatus having a conveyor for simultaneously positioning multiple RFID IC's within multiple test chambers.

As shown in FIGS. 5A and 5B, a fixture 500 in accordance with another exemplary embodiment of the invention may include a carriage assembly 512 comprised of a conveyor 514 having one or more supports 516 arrayed thereon. An RFID IC 518 may be temporarily mounted or loaded onto each support 516 (see FIGS. 3A and 3B) and coupled to the antenna 520 formed thereon. The conveyor 514 may pass through one or more test chambers 522 so that each support 516, and the RFID IC 518 mounted thereon, is enclosed within the chamber 522 during testing. Preferably, the conveyor 514 moves at a constant rate so that each RFID IC 518 moves through the test chamber 522 for a period of time sufficient to functionally test the RFID IC's 518, and to write any required information to the circuit's memory. Alternatively, the conveyor 514 may be indexed (i.e., alternately moved and stopped) so that each RFID IC 518 is transported into the test chamber 522 and held there momentarily while it is tested.

As shown in FIG. 5B, the fixture 500 may include multiple chambers 522 (three are shown) so that a plurality of RFID IC's 516 may be tested simultaneously. The carriage assembly 514 may include a corresponding number of holders 516 (e.g., multiple rows of three supports 516 are shown) so that an RFID IC 518 may be positioned within each chamber 522.

In an exemplary embodiment, the test chamber 522 may comprise a miniaturized anechoic chamber formed of or lined with RF absorbing material. This RF absorbing material creates an anechoic environment which simulates a free space. The RF absorbing material may also sufficiently reduce RF emissions from the test chamber 522 so that any RF field outside of the chamber 522 has insufficient intensity to activate an RFID IC.

Alternatively, the test chamber 522 may comprise a metallic box (or cylinder, sphere, etc.) forming a resonant cavity sized to have a resonant frequency which is the same as the RFID system's carrier frequency. The resonant cavity may be excited by a probe (i.e., a hook or pin) which couples the RF power in a transmission line (i.e., a coaxial cable) from the transceiver to the field in the resonant cavity. See, R. E. Collin, *Foundations for Microwave Engineering*, 2nd Ed., McGraw Hill, 1992, which is herein incorporated by reference in its entirety.

It is believed that the methods and apparatus for providing wireless radio frequency testing of RFID integrated circuits of the present invention and many of its attendant advantages will be understood by the foregoing description, and it will be apparent that various changes may be made in the form, construction and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A system for performing wireless radio frequency testing of a radio frequency circuit, comprising:
    a fixture including a probe for physically and electrically contacting the circuit to feed a radio frequency signal into the circuit;
    a first coupler interconnected with said fixture for propagating the radio frequency signal to said fixture; and
    a second coupler configured to transmit the radio frequency signal to said first coupler via a wireless link established between said first and second couplers.

2. The system according to claim 1, further comprising a radio frequency signal transmitter interconnected with said second coupler for generating the radio frequency signal.

3. The system according to claim 1, wherein said fixture receives a radio frequency return signal generated by the circuit in response to the radio frequency signal.

4. The system according to claim 3, wherein the radio frequency return signal is a modulated back-scattered radio frequency signal.

5. The system according to claim 3, wherein said first coupler is configured to transmit the radio frequency return signal to said second coupler via the wireless link.

6. The system according to claim 5, further comprising a tester interconnected with said second coupler, said tester including a radio frequency signal transmitter for generating the radio frequency signal and a decoder for decoding the radio frequency return signal.

7. The system according to claim 1, wherein the circuit comprises an unsingulated die of a wafer having an antenna pad, and said probe is adapted for contacting said antenna pad.

8. The system according to claim 7, wherein at least one of said first and second radio frequency transmitting and receiving assemblies comprises an antenna.

9. The system according to claim 8, wherein the probe includes an impedance matching circuit for matching the impedance of the antenna to the impedance of the circuit.

10. The system according to claim 7, wherein at least one of said first and second couplers comprises an open-ended waveguide coupler.

11. The system according to claim 7, wherein at least one of said first and second couplers comprises a tunnel-like wave launcher.

12. The system according to claim 1, wherein the circuit is a radio frequency identification integrated circuit.

13. The system according to claim 12, wherein the radio frequency identification integrated circuit is packaged within a plastic molded package, and wherein said fixture comprises a support having a holder for temporarily mounting the packaged circuit to the support and at least one terminal for coupling a pin of the packaged circuit to said first coupler.

14. The system according to claim 13, wherein at least one of said first and second couplers comprises an antenna.

15. The system according to claim 13, wherein at least one of said first and second couplers comprises an open-ended waveguide coupler.

16. The system according to claim 12, wherein at least one of said first and second couplers comprises a tunnel-like wave launcher.

17. The system according to claim 1, wherein at least one of said first and second couplers comprises an antenna.

18. The system according to claim 1, wherein at least one of said first and second couplers comprises an open-ended waveguide coupler.

19. The system according to claim 1, wherein at least one of said first and second couplers comprises a tunnel-like wave launcher.

20. A system for performing wireless radio frequency testing of a radio frequency identification integrated circuit, comprising:
    a fixture including a probe for physically and electrically contacting the radio frequency identification integrated circuit to feed a radio frequency interrogating signal into the radio frequency identification integrated circuit and receive a radio frequency return signal generated by the radio frequency identification integrated circuit in response thereto; and
    first and second couplers establishing a wireless link for transmitting and receiving the radio frequency interrogation signal and the radio frequency return signal, said first coupler interconnected with said fixture for receiving the radio frequency interrogating signal and transmitting the radio frequency return signal and said second coupler interconnected with said tester for transmitting the radio frequency interrogating signal and receiving the radio frequency return signal.

21. The system according to claim 20, further comprising a radio frequency interrogation signal transmitter interconnected with said second coupler for generating a radio frequency interrogating signal to interrogate the radio frequency identification integrated circuit.

22. The system according to claim 20, further comprising a tester interconnected with said second coupler, said tester including a radio frequency interrogation signal transmitter for generating a radio frequency interrogating signal to interrogate the radio frequency identification integrated circuit and a decoder for decoding the radio frequency return signal generated by the radio frequency identification integrated circuit in response to the radio frequency interrogation signal.

23. The system according to claim 20, wherein the radio frequency identification integrated circuit comprises an unsingulated die of a wafer, and said probe is adapted for contacting said antenna pads of the die.

24. The system according to claim 23, wherein at least one of said first and second radio frequency transmitting and receiving assemblies comprises an antenna.

25. The system according to claim 24, wherein the probe includes an impedance matching circuit for matching the impedance of the antenna to the impedance of the radio frequency identification integrated circuit.

26. The system according to claim 23, wherein at least one of said first and second couplers comprises an open-ended waveguide coupler.

27. The system according to claim 23, wherein at least one of said first and second couplers comprises a tunnel-like wave launcher.

28. The system according to claim 20, wherein the radio frequency identification integrated circuit is packaged within a plastic molded package, and wherein said fixture comprises a support having a holder for temporarily mounting the packaged radio frequency identification integrated circuit to the support and a terminal for coupling a pin of the packaged radio frequency identification integrated circuit to said first coupler.

29. The system according to claim 28, wherein at least one of said first and second couplers comprises an antenna.

30. The system according to claim 28, wherein at least one of said first and second couplers comprises an open-ended waveguide coupler.

31. The system according to claim 28, wherein at least one of said first and second couplers comprises a tunnel-like wave launcher.

32. The system according to claim 20, wherein at least one of said first and second couplers comprises an antenna.

33. The system according to claim 20, wherein at least one of said first and second couplers comprises an open-ended waveguide coupler.

34. The system according to claim 20, wherein at least one of said first and second couplers comprises a tunnel-like wave launcher.

35. A system for performing wireless radio frequency testing of a radio frequency identification integrated circuit, comprising:
   a tester for generating a radio frequency interrogating signal to interrogate the radio frequency identification integrated circuit and for decoding a radio frequency return signal generated by the radio frequency identification integrated circuit in response to the radio frequency interrogation signal;
   a fixture including a probe for physically and electrically contacting the radio frequency identification integrated circuit to feed the radio frequency interrogating signal into the radio frequency identification integrated circuit and receive the radio frequency return signal generated in response thereto; and
   first and second couplers establishing a wireless link for transmitting and receiving the radio frequency interrogation signal and the radio frequency return signal, said first coupler interconnected with said fixture for receiving the radio frequency interrogating signal and transmitting the radio frequency return signal and said second coupler interconnected with said tester for transmitting the radio frequency interrogating signal and receiving the radio frequency return signal.

36. The system according to claim 35, wherein the radio frequency return signal is a modulated back-scattered radio frequency signal.

37. The system according to claim 35, wherein the radio frequency identification integrated circuit comprises an unsingulated die of a wafer having at least one antenna pad, and said probe is adapted for contacting said antenna pad.

38. The system according to claim 37, wherein at least one of said first and second radio frequency transmitting and receiving assemblies comprises an antenna.

39. The system according to claim 38, wherein the probe includes an impedance matching circuit for matching the impedance of the antenna to the impedance of the radio frequency identification integrated circuit.

40. The system according to claim 37, wherein at least one of said first and second couplers comprises an open-ended waveguide coupler.

41. The system according to claim 37, wherein at least one of said first and second couplers comprises a tunnel-like wave launcher.

42. The system according to claim 35, wherein the radio frequency identification integrated circuit is packaged within a plastic molded package, and wherein said fixture comprises a support having a holder for temporarily mounting the packaged radio frequency identification integrated circuit to the support and a terminal for coupling a pin of the packaged radio frequency identification integrated circuit to said first coupler.

43. The system according to claim 42, wherein at least one of said first and second couplers comprises an antenna.

44. The system according to claim 42, wherein at least one of said first and second couplers comprises an open-ended waveguide coupler.

45. The system according to claim 42, wherein at least one of said first and second couplers comprises a tunnel-like wave launcher.

46. The system according to claim 35, wherein at least one of said first and second couplers comprises an antenna.

47. The system according to claim 35, wherein at least one of said first and second couplers comprises an open-ended waveguide coupler.

48. The system according to claim 35, wherein at least one of said first and second couplers comprises a tunnel-like wave launcher.

49. A method for performing wireless radio frequency testing of a radio frequency identification integrated circuit, comprising the steps of:
   generating a radio frequency interrogating signal for interrogating the radio frequency identification integrated circuit;
   transmitting the generated radio frequency interrogating signal between a first coupler and a second coupler via a wireless link; and
   feeding the received radio frequency interrogating signal into the radio frequency identification integrated circuit via a probe that is in physical contact with the radio frequency identification integrated circuit.

50. The method according to claim 49, further comprising the step of receiving a radio frequency return signal from the radio frequency identification integrated circuit in response to the radio frequency interrogation signal.

51. The method according to claim 50, wherein the radio frequency return signal is a modulated back-scattered signal.

52. The method according to claim 50, further comprising the step of decoding the radio frequency return signal and characterizing the function of the radio frequency identification integrated circuit.

53. The method according to claim 50, further comprising the step of transmitting the radio frequency return signal from the first coupler to the second coupler via the wireless link.

54. The method according to claim 53, further comprising the step of decoding the radio frequency return signal to characterize the function of the radio frequency identification integrated circuit.

55. The method according to claim 49, wherein the radio frequency identification integrated circuit comprises an unsingulated die of a wafer, and said feeding step further comprises landing a probe on the antenna pads of the die.

56. The method according to claim 49, wherein the radio frequency identification integrated circuit is packaged within a plastic-molded package, and wherein feeding step comprises temporarily mounting the packaged radio frequency identification integrated circuit in a fixture which couples a pin of the packaged radio frequency identification integrated circuit to said first coupler.

* * * * *